(12) United States Patent
Fukuhara et al.

(10) Patent No.: US 11,004,683 B2
(45) Date of Patent: May 11, 2021

(54) IMPRINT APPARATUS, IMPRINT METHOD, AND METHOD OF MANUFACTURING SEMICONDUCTOR DEVICE

(71) Applicant: TOSHIBA MEMORY CORPORATION, Tokyo (JP)

(72) Inventors: Kazuya Fukuhara, Suginami Tokyo (JP); Tetsuro Nakasugi, Yokohama Kanagawa (JP); Masayuki Hatano, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/107,873

(22) Filed: Aug. 21, 2018

(65) Prior Publication Data

US 2019/0221421 A1    Jul. 18, 2019

(30) Foreign Application Priority Data

Jan. 15, 2018 (JP) .............................. JP2018-004444

(51) Int. Cl.
  *H01L 21/027*  (2006.01)
  *G03F 7/00*  (2006.01)
(52) U.S. Cl.
  CPC ........ *H01L 21/0271* (2013.01); *G03F 7/0002* (2013.01)
(58) Field of Classification Search
  None
  See application file for complete search history.

(56) References Cited

U.S. PATENT DOCUMENTS

| | | | |
|---|---|---|---|
| 2009/0201475 A1* | 8/2009 | Peckerar | G03F 1/50 355/53 |
| 2013/0078820 A1* | 3/2013 | Mikami | G03F 7/0002 438/778 |
| 2016/0297117 A1* | 10/2016 | Sato | G02B 5/1861 |
| 2016/0346962 A1 | 12/2016 | Kawamura et al. | |
| 2017/0040161 A1 | 2/2017 | Sato | |
| 2017/0168312 A1* | 6/2017 | Kelkar | G02B 27/142 |
| 2017/0210036 A1 | 7/2017 | Hamaya et al. | |

(Continued)

FOREIGN PATENT DOCUMENTS

| | | |
|---|---|---|
| EP | 2996393 A1 | 3/2016 |
| EP | 3029992 A2 | 6/2016 |
| JP | 2011181548 A | 9/2011 |

(Continued)

OTHER PUBLICATIONS

U.S. Appl. No. 15/905,310, filed Feb. 26, 2018.

*Primary Examiner* — Khaja Ahmad
(74) *Attorney, Agent, or Firm* — Kim & Stewart LLP

(57) ABSTRACT

According to one embodiment, an imprint apparatus includes a first light source positioned to irradiate a substrate with light, a second light source positioned to irradiate the substrate with light, an illuminance changing portion selectively configured to change the illuminance distribution of light from the first light source on an irradiation surface on the substrate, and a controller configured to control the first light source, the second light source and the illuminance changing portion to irradiate the substrate with light from the first light source, and to subsequently irradiate the substrate with light from the second light source directly through the template.

16 Claims, 9 Drawing Sheets

(56) References Cited

U.S. PATENT DOCUMENTS

2017/0285331 A1* 10/2017 Miyaharu .......... G02B 26/0833
2018/0259863 A1* 9/2018 Komaki .................. G01D 5/28

FOREIGN PATENT DOCUMENTS

| JP | 2016034164 A | 3/2016 |
| JP | 2016174150 A | 9/2016 |
| JP | 2016225370 A | 12/2016 |
| JP | 2017034164 A | 2/2017 |

* cited by examiner

IMPRINT APPARATUS, IMPRINT METHOD, AND METHOD OF MANUFACTURING SEMICONDUCTOR DEVICE

CROSS-REFERENCE TO RELATED APPLICATION

This application is based upon and claims the benefit of priority from Japanese Patent Application No. 2018-004444, filed Jan. 15, 2018, the entire contents of which are incorporated herein by reference.

FIELD

Embodiments described herein relate generally to an imprint apparatus, an imprint method, and a method of manufacturing a semiconductor device.

BACKGROUND

As a method of forming a fine pattern, an imprint method is proposed. In the imprint method, a resist is applied onto a film to be processed, a template on which a fine pattern is formed is pressed against the resist, the resist fills a recessed portion or portions of the template, and the resist is cured by irradiation thereof with ultraviolet rays. The resist after curing is released from the template and serves as a mask used in processing of the film to be processed.

DETAILED DESCRIPTION

Embodiments provide an imprint apparatus with a further improved throughput, an imprint method, and a method of manufacturing a semiconductor device.

In general, according to one embodiment, an imprint apparatus includes a first light source positioned to irradiate a substrate with light, a second light source positioned to irradiate the substrate with light, an illuminance changing portion selectively configured to change the illuminance distribution of light from the first light source on an irradiation surface on the substrate, and a controller configured to control the first light source, the second light source and the illuminance changing portion to irradiate the substrate with light from the first light source, and to subsequently irradiate the substrate with light from the second light source directly through the template.

First Embodiment

A first embodiment will be described with reference to FIGS. 1 to 6.

(Configuration Example of Imprint Apparatus)

Figure 1:
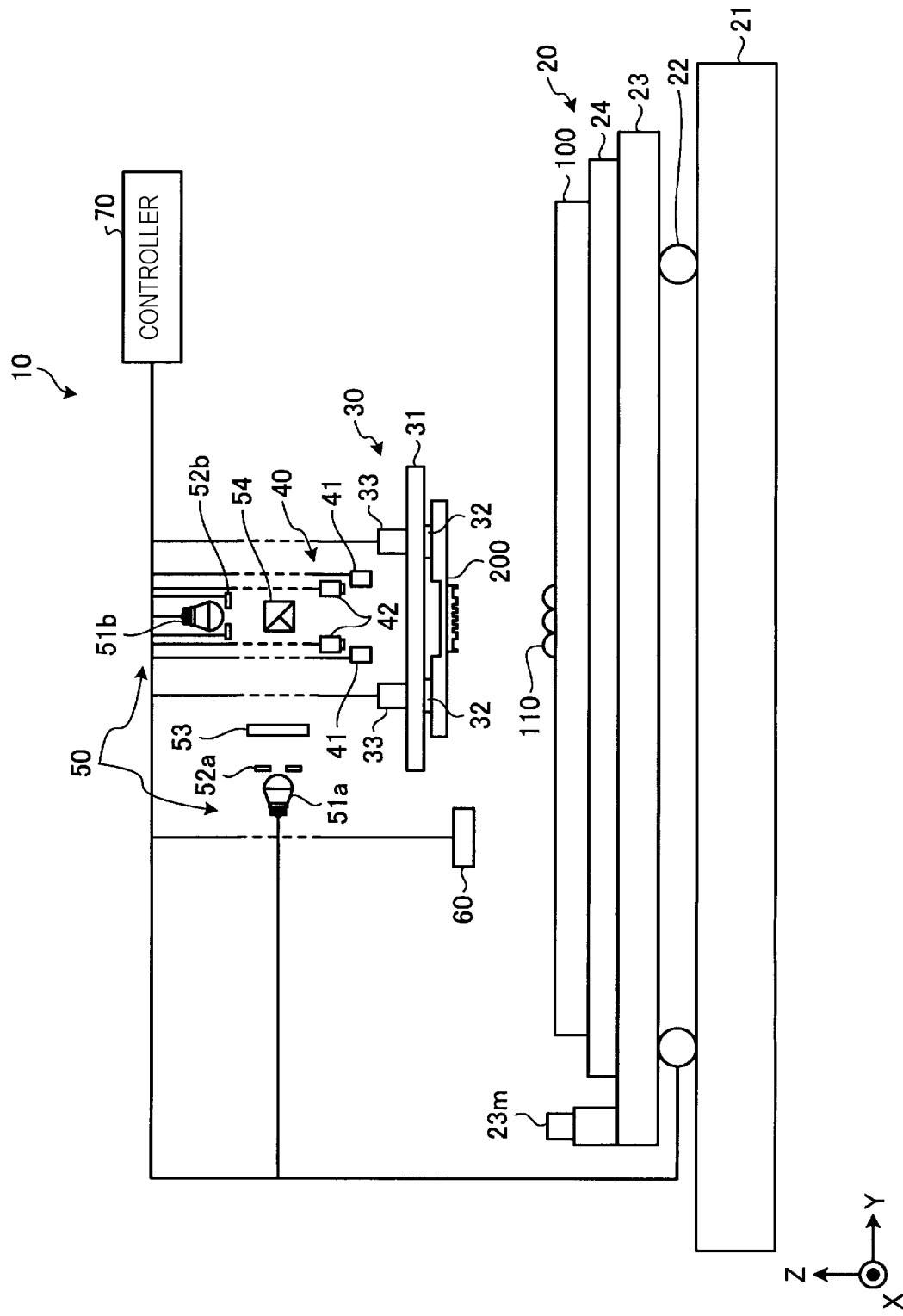
FIG. 1 is a diagram illustrating the overall configuration of an imprint apparatus according to a first embodiment.

FIG. 1 illustrates the overall configuration of an imprint apparatus 10 according to the first embodiment. The imprint apparatus 10 is a device that transfers a pattern (for example, a nanoscale pattern) of a template 200 as a master onto a resist 110 on a wafer 100 as a substrate. For example, a technique of optical nanoimprint lithography is used for transferring the pattern.

As shown in FIG. 1, the imprint apparatus 10 includes a wafer holding portion 20, a template holding portion 30, an alignment portion 40, an exposure portion 50, a resist supply portion 60 and a controller 70.

The controller 70 is configured as, for example, a computer including a hardware processor such as a CPU (Central Processing Unit), a memory and an HDD (Hard Disk Drive). The controller 70 controls the operations of the wafer holding portion 20, the template holding portion 30, the alignment portion 40, the exposure portion 50 and the resist supply portion 60.

The wafer holding portion 20 includes a stage surface plate 21, a drive portion 22, a wafer stage 23 and a wafer chuck 24. The stage surface plate 21 is installed on a floor or a table or the like for the imprint apparatus 10. The drive portion 22 is provided on the stage surface plate 21. The drive portion 22 moves the wafer stage 23 while also supporting it. The moving direction of the wafer stage 23 is, for example, two directions (X direction and Y direction) intersecting each other in a horizontal plane. The drive portion 22 may be configured to be able to rotate the wafer stage 23 in a direction in which the vertical direction (Z direction) represents the rotation axis. The wafer stage 23 is a plate-like member installed along the horizontal plane on the upper surface of the drive portion 22. A reference mark 23m is provided on the wafer stage 23. The reference mark 23m is used for calibration of the alignment portion 40 and positioning (posture control/adjustment) of the template 200. The wafer chuck 24 is provided on the wafer stage 23. The wafer chuck 24 chucks (fixes) the wafer 100 onto the wafer stage 23, for example, by vacuum suction.

With the above configuration, the wafer holding portion 20 can horizontally hold and move the wafer 100 with the wafer 100 fixed on the wafer stage 23. The wafer 100 is held at a predetermined position of the wafer stage 23 in a state in which the resist 110 is applied to the upper surface thereof. The application of the resist 110 to the wafer 100 is performed, for example, by dropping o droplets of a resist as described below.

The resist supply portion 60 is disposed above (in the Z direction) the wafer holding portion 20. The resist supply portion 60 drops and applies several thousands to tens of thousands of droplet-like resist 110 droplets onto a part region (shot region) of the wafer 100 to be patterned, i.e., processed. The resist 110 is, for example, a photocurable resist that is cured by light irradiation. It is noted that the resist 110 may be applied to a part region or the entire surface of the wafer 100.

The template holding portion 30 is disposed above the wafer holding portion 20, spaced from the wafer holding portion 20 by a predetermined distance. The template holding portion 30 includes a template stage 31, a template chuck 32 and a pressing portion 33. The template stage 31 is a plate-like member having a through hole (not shown) at the central portion thereof. The template chuck 32 is provided on the lower surface of the template stage 31. The template chuck 32 chucks the template 200 onto the template stage 31, for example, by vacuum suction. The template 200 is held on the template stage 31 by the template chuck 32 with the pattern-formed side facing the wafer holding portion 20. The pressing portion 33 is disposed on the upper surface of the template stage 31. The pressing portion 33 is directly or indirectly fixed to a top plate or the like of the imprint apparatus 10. The pressing portion 33 is, for example, an actuator for generating a pressing force in the vertical direction. The pressing portion 33 moves the template 200 together with the template chuck 32 and the template stage 31 toward the wafer 100, and presses the patterned portion of the template 200 into the resist 110.

With the above configuration, the template holding portion 30 can move downward while holding the template 200, and press it against the wafer 100. As a result, the pattern is transferred onto the resist 110 previously applied to the wafer 100. It is noted that the transfer of the pattern is not limited only to the downward movement of the template holding portion 30, and the transfer of the pattern can also be performed by the upward movement of the wafer holding portion 20.

The alignment portion 40 is disposed above the template holding portion 30. The alignment portion 40 includes a plurality of alignment light sources 41 and a plurality of detection portions 42. The plurality of alignment light sources 41 and the plurality of detection portions 42 are arranged above the template holding portion 30 so as to surround the central portion of the template 200 held by the template holding portion 30. Each of the alignment light sources 41 irradiates light for alignment to a reference mark (not shown) or the like formed on the wafer 100. Each of the detection portions 42 detects a reference mark or the like irradiated with the light for alignment.

With the above configuration, the alignment portion 40 aligns the wafer 100 held by the wafer holding portion 20 with respect to the template 200 held by the template holding portion 30.

The exposure portion 50 is also installed above the template holding portion 30. The exposure portion 50 includes a first light source 51a that irradiates light as a first light, a first aperture 52a, and a second light source 51b that irradiates light as a second light, a second aperture 52b, an illuminance changing portion 53 and a half-silvered mirror 54.

The half-silvered mirror 54, the illuminance changing portion 53, the first aperture 52a and the first light source 51a are disposed above the template holding portion 30, for example, spaced from one another in the Y direction, in this order from the side closest to the center of the template holding portion 30. The half-silvered mirror 54, the illuminance changing portion 53, the first aperture 52a and the first light source 51a are disposed so that their central portions are linearly aligned along the Y axis direction.

The first light source 51a is a lamp that emits light capable of at least partially curing the resist 110, and is, for example, a mercury lamp or the like. The light from light source 51a may be ultraviolet light or longer wavelength light in some examples. The first aperture 52a transmits a part of the light from the first light source 51a to the half-silvered mirror 54, and blocks the remaining light.

The half-silvered mirror 54, the second aperture 52b and the second light source 51b are disposed in the Z direction in this order from the template holding portion 30 side. The template holding portion 30, the half-silvered mirror 54, the second aperture 52b and the second light source 51b are disposed so that their central portions are aligned on the Z axis.

The second light source 51b is a lamp that irradiates ultraviolet rays or the like capable of curing the resist 110, and is, for example, a mercury lamp or the like. The second aperture 52b transmits a part of the light from the second light source 51b to the half-silvered mirror 54, and blocks the remaining light.

The half-silvered mirror 54 reflects light from the first light source 51a and the second light source 51b to the template 200 side and the wafer 100 side through the template holding portion 30. As a result, light from the first light source 51a and the second light source 51b is irradiated onto the resist 110 on the wafer 100. By irradiating the resist 110 with light in a state in which the template 200 is pressed into the resist 110, the resist 110 is cured and the pattern of the template 200 is transferred.

Next, the exposure portion 50 will be described in more detail with reference to FIGS. 2 to 4.

Figure 2:
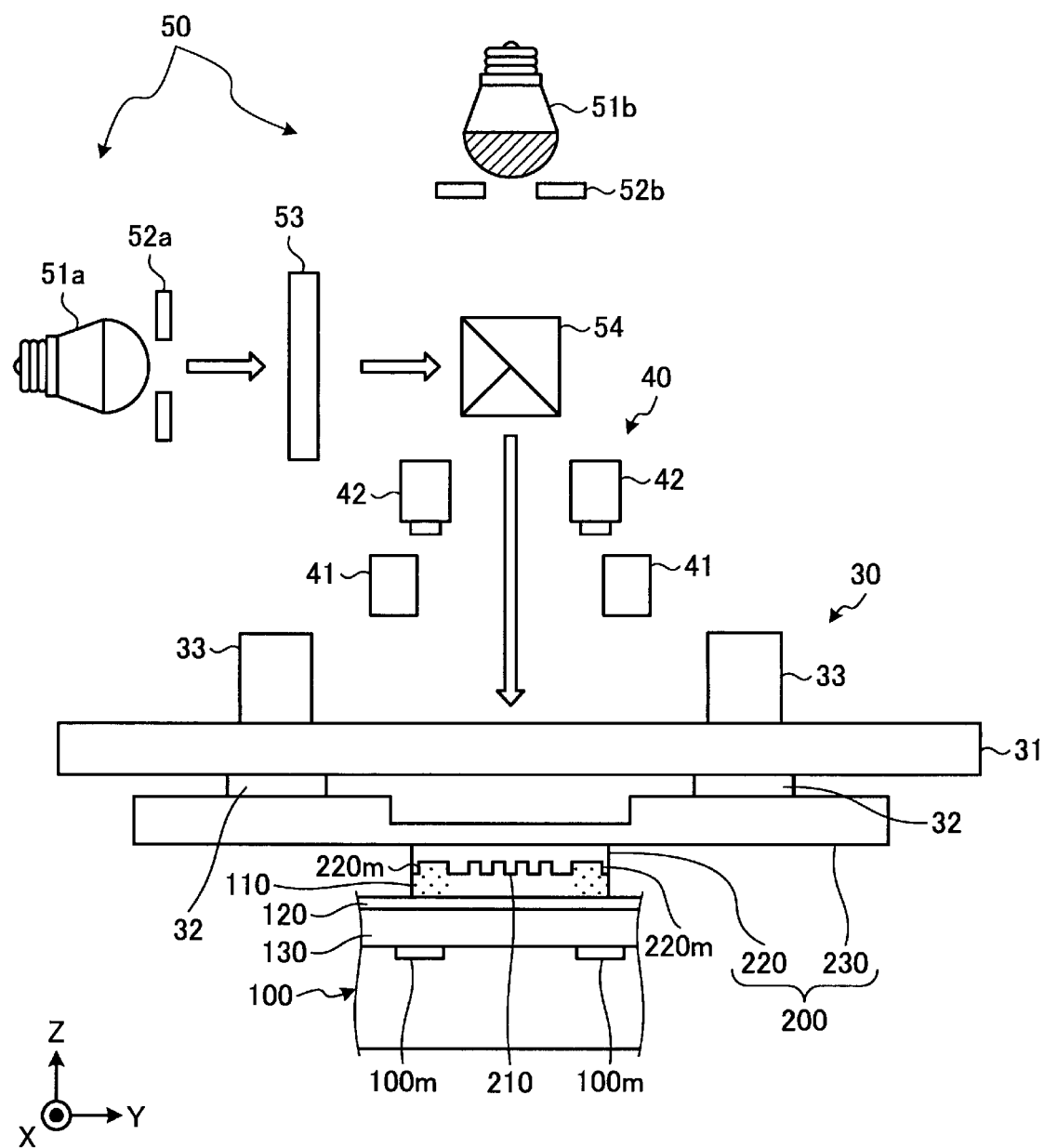
FIG. 2 is an enlarged view of a part of the imprint apparatus according to the first embodiment.

FIG. 2 shows an enlarged view of a part of the imprint apparatus 10 according to the first embodiment. As shown in FIG. 2, a reference mark 100m, a base film 130 and a film to be processed 120 are formed on the wafer 100 in this order. The wafer 100 is a semiconductor substrate including, for example, silicon or the like. The resist 110 is applied to the film to be processed 120. Further, the template 200 includes, for example, a template substrate 230 formed of quartz or the like and a mesa portion 220. A reference mark 220m for alignment and a pattern 210 for transfer are formed on the mesa portion 220. The pattern 210 has, for example, a recess portion and a projection portion.

In FIG. 2, the wafer 100 is held by the wafer holding portion 20. The template 200 is held by the template holding portion 30 with the pattern 210 facing the wafer 100. Further, the wafer 100 and the template 200 are aligned by the alignment portion 40 with reference to the respective reference marks 100m, 220m and the like, and the pattern 210 of the template 200 is pressed against the resist 110 on the film to be processed 120.

In FIG. 2, in this state, the first light source 51a is turned on. The light emitted from the first light source 51a passes through the illuminance changing portion 53 and reaches the half-silvered mirror 54, which, in turn, reflects the light toward the template 200 and the wafer 100. At this time, the illuminance changing portion 53 changes an illuminance distribution of the light within the irradiation surface on the wafer 100. This state is shown in FIG. 3.

Figure 3:
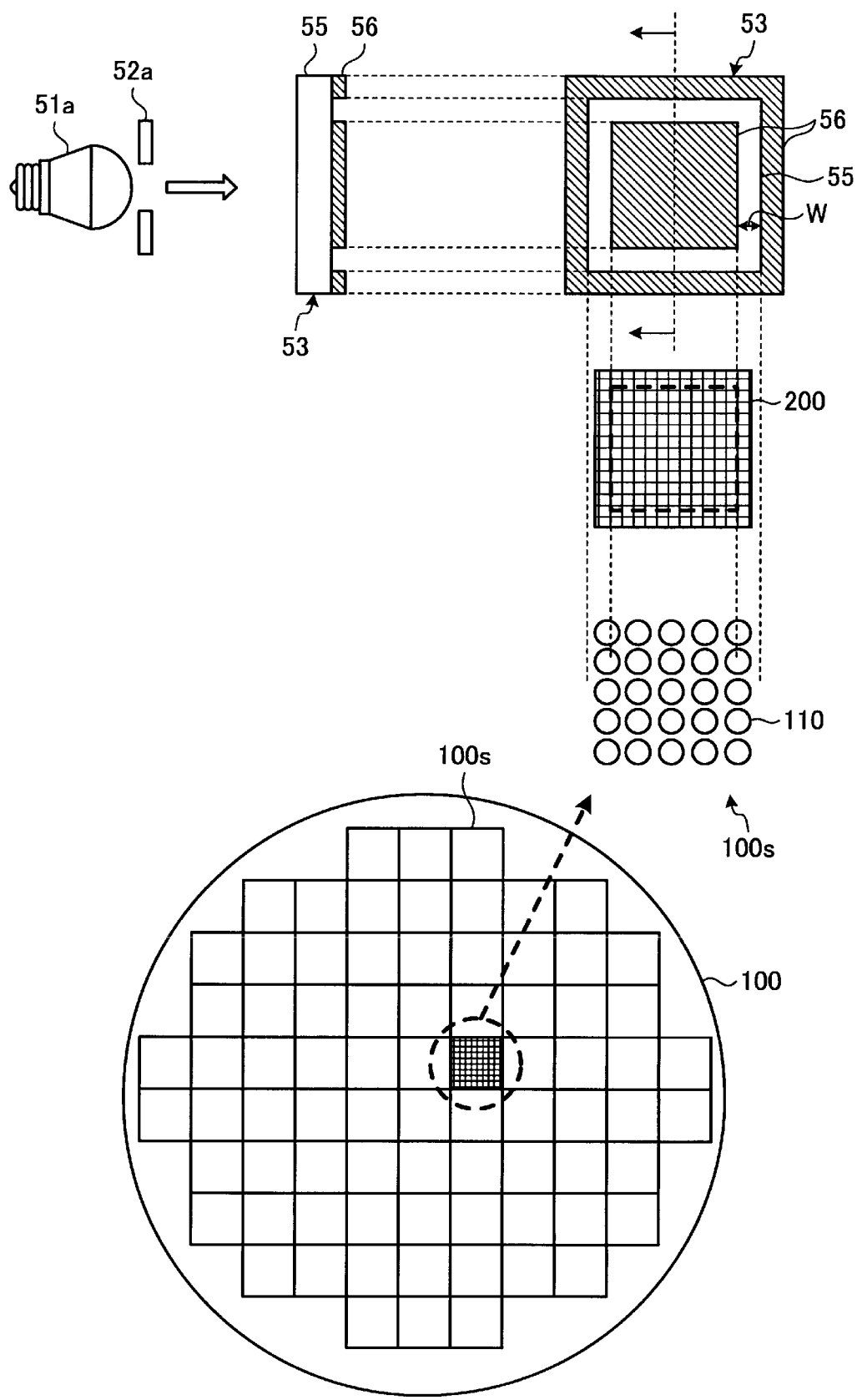
FIG. 3 is a diagram for explaining a function of an illuminance changing portion according to the first embodiment.

FIG. 3 shows a diagram for explaining a function of an illuminance changing portion 53 according to the first embodiment.

As shown in FIG. 3, the illuminance changing portion 53 is configured as, for example, a photomask including a photomask substrate 55 and a light shielding film 56. In the upper stage of FIG. 3, a plan view of the photomask is shown on the right side, and a cross-sectional view of the photomask is shown in the left side. The photomask is disposed, for example, with the photomask substrate 55 side thereof facing the first light source 51a. The photomask substrate 55 is a plate-like member formed of, for example, glass, quartz or the like. The photomask substrate 55 almost completely allows passage of the light of the first light source 51a therethrough. The light shielding film 56 is formed of, for example, a Cr-based material. The Cr-based material is, for example, Cr, CrO, CrN and the like. The light shielding film 56 is patterned, for example, so that a part of the photomask substrate 55 is exposed in a frame shape. The width W of the exposed portion of the photomask substrate 55 is, for example, 1 mm or less, more preferably, 30 µm or more and 40 µm or less. The light shielding film 56 almost completely shields the light of the first light source 51a. Therefore, the light passing through the illuminance changing portion 53 is blocked at the portion where the light shielding film 56 is formed, and is transmitted at the portion where the photomask substrate 55 is exposed without the light shielding film 56 thereon. Such a photomask can be manufactured by using, for example, a photolithography method and an etching method.

As shown in the plan view of the middle stage of FIG. 3, the template 200 is formed somewhat smaller than the illuminance changing portion 53 configured as a photomask. As described above, the template 200 is formed of quartz or the like, for example, and the template stage 31 holding the template 200 has a through hole in the central portion thereof. The light which is not blocked by the light shielding film 56 and passes through the illuminance changing portion 53 passes through the through hole in the template stage 31, and further passes through the edge portion and to the outside of the edge portion of the template 200. The central portion of the template 200 is blocked from light by the light shielding film 56 and is not irradiated.

A plurality of shot regions 100s is disposed on the wafer 100. One shot region 100s is a region to be patterned by one imprint (pressing of the template 200). For every imprint, thousands to tens of thousands of resist 110 droplets are dropped onto the shot region 100s. As shown in the plan view of the lower stage of FIG. 3, in the shot region 100s before imprinting, the droplets of the resist 110 are arranged in a dot shape. The shot region 100s has approximately the same size (area) as the template 200. The light which is not blocked by the light shielding film 56 and passes through the illuminance changing portion 53 is irradiated to the edge portion of the resist 110 and outside of the edge portion where the wafer 100 is exposed. In the central portion of the shot region 100s, the light is blocked by the light shielding film 56 and is not irradiated.

That is, the illuminance changing portion 53 relatively increases the illuminance of light within the irradiation surface on the wafer 100 at the edge portion of the shot region 100s and relatively lowers it at the central portion. Preferably, the illuminance change portion 53 causes the illuminance distribution of the light within the irradiation surface on the wafer 100 to be the illuminance at which the curing of the resist 110 proceeds at the edge portion of the shot region 100s, and to be the illuminance at which the curing of the resist 110 does not proceed at the central portion. More preferably, the illuminance changing portion 53 causes the illuminance to be zero at the central portion of the shot region 100s.

Figure 4:
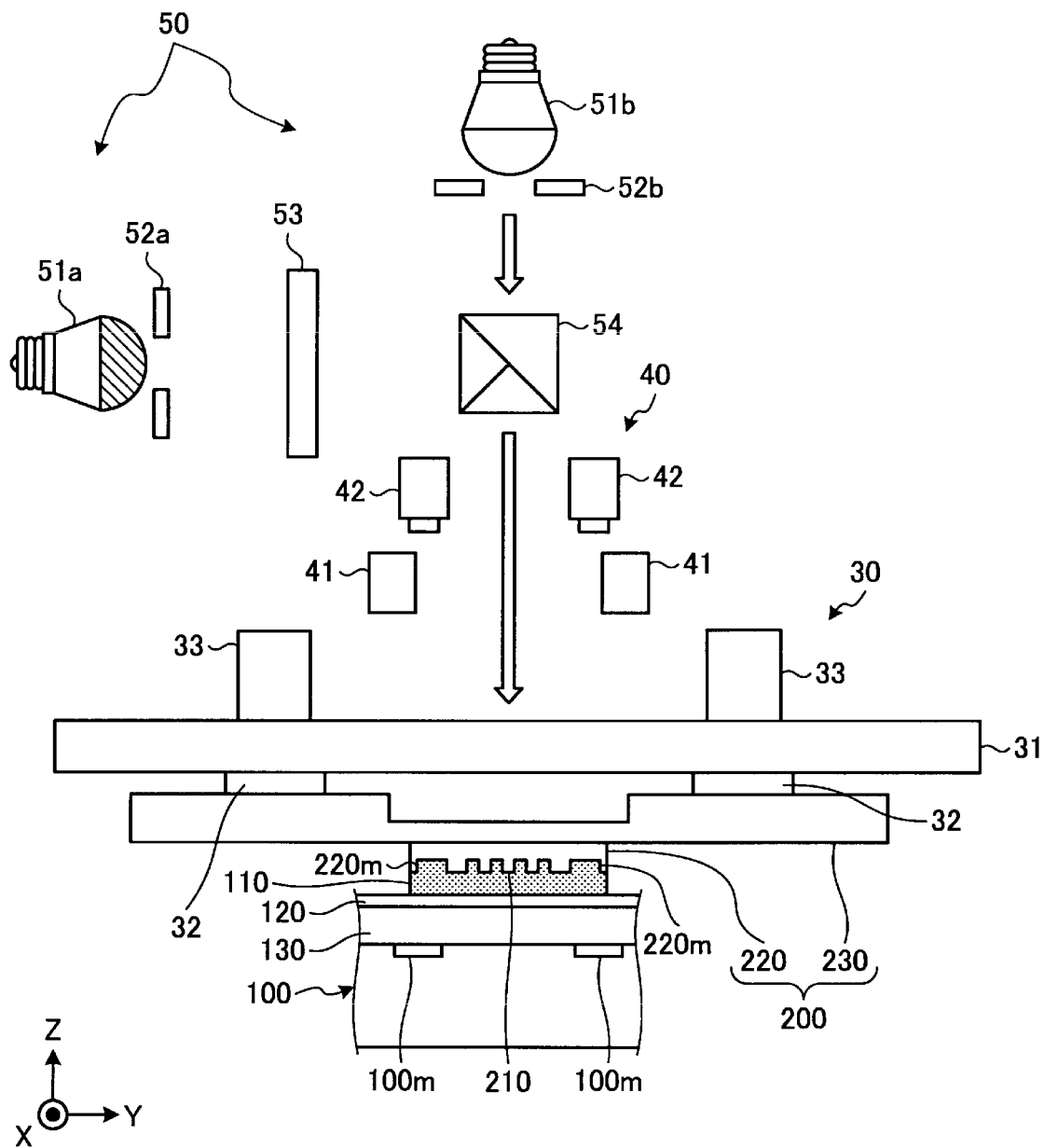
FIG. 4 is an enlarged view of a part of the imprint apparatus according to the first embodiment.

FIG. 4 shows an enlarged view of a part of the imprint apparatus 10 according to the first embodiment. Also in FIG. 4, the pattern 210 of the template 200 is pressed against the resist 110 on the wafer 100.

In FIG. 4, with the resist in the shot region 100a exposed in this state, the second light source 51b is turned on. The light emitted from the second light source 51b reaches the half-silvered mirror 54, which, in turn, allows the light to pass toward the template 200 and the wafer 100. At this time, substantially all of the light from the second light source 51b is irradiated onto the wafer 100. The illuminance distribution of light within the irradiated surface on the wafer 100 from the second light source 51b is substantially equal in each region of the shot region 100s.

In the imprint apparatus 10 configured as described above, each portion is controlled by the controller 70. That is, the controller 70 controls the wafer holding portion 20 to move the wafer 100 held by the wafer holding portion 20. Further, the controller 70 controls the resist supply portion 60 to supply the resist 110 to the wafer 100. Further, the controller 70 controls the alignment portion 40 to detect the reference marks 100m and 220m, and to cause the wafer 100 and the template 200 to be aligned. Further, the controller 70 controls the template holding portion 30 to press the template 200 against the resist 110 on the wafer 100.

When the template 200 is pressed into the resist 110, the resist 110 gradually fills in the recessed portion of the pattern 210. The filling speed of the resist 110 in the recess portion is usually slow at the central portion of the shot region 100s and fast at the outer peripheral portion. Further, at the outermost peripheral portion of the shot region 100s, there is usually no pattern 210 in the template 200. Therefore, at the edge portion of the shot region 100s, the resist 110 is filled into the recesses or spreads out faster than it does in the central portion of the shot region 100s.

In addition, the controller 70 controls the exposure portion 50 to turn on the first light source 51a and the second light source 51b to irradiate light onto the wafer 100.

When light is irradiated onto the wafer 100, the controller 70, for example, turns on the first light source 51a first. The light from the first light source 51a passes through the illuminance changing portion 53 and is irradiated onto the wafer 100. At this time, filling of the recess portion of the template 200 is still in progress at the central portion of the resist 110 on the wafer 100. However, since light passing through the illuminance changing portion 53 is used, light is not irradiated at the central portion of the resist 110, and curing of the resist 110 does not proceed in the central portion of the shot region 100s. On the other hand, curing proceeds at the edge portion of the resist 110 in which filling into the recessed portions of the template 200 is completed. After a lapse of a predetermined time, the controller 70 switches the light from the first light source 51a to the light from the second light source 51b. The end of the time period during which the first light source 51a irradiates the resist 110 and shot region 100s is, for example, the time at which filling of the recessed portions of the template 200 are filled with resist 110 is completed in the central portion of the resist 110. In addition, the end of the time period of irradiation of the shot region 100s and resist 110 using the first light source 51a is preferably, for example, the time at which the resist 110 at the edge portion is semi-cured, i.e., it is partially cured. The semi-cured state of the resist 110 is a state in which curing of the resist 110 is in progress but is not completed. The semi-cured resist 110 is in a state in which the resist is not completely cured, but the viscosity thereof is increased while maintaining a slight flowability of the resist 110.

At this stage, the controller 70 turns off the first light source 51a and turns on the second light source 51b. The light from the second light source 51b is irradiated onto the wafer 100. As a result, the entire area of the resist 110 on the wafer 100 is irradiated with light. Therefore, further curing is started also at the central portion of the resist 110. Further, at the edge portion of the resist 110, curing further progresses. Even after the edge portion of the resist 110 is completely cured, the controller 70 continues to irradiate the light by the second light source 51b until the central portion of the resist 110 is completely cured. After the entire resist 110 is completely cured, and the hardness of the edge portion and the central portion of the resist 110 becomes substantially equal, and the controller 70 turns off the second light source 51b.

(Example of Imprint Processing)

Figure 5:
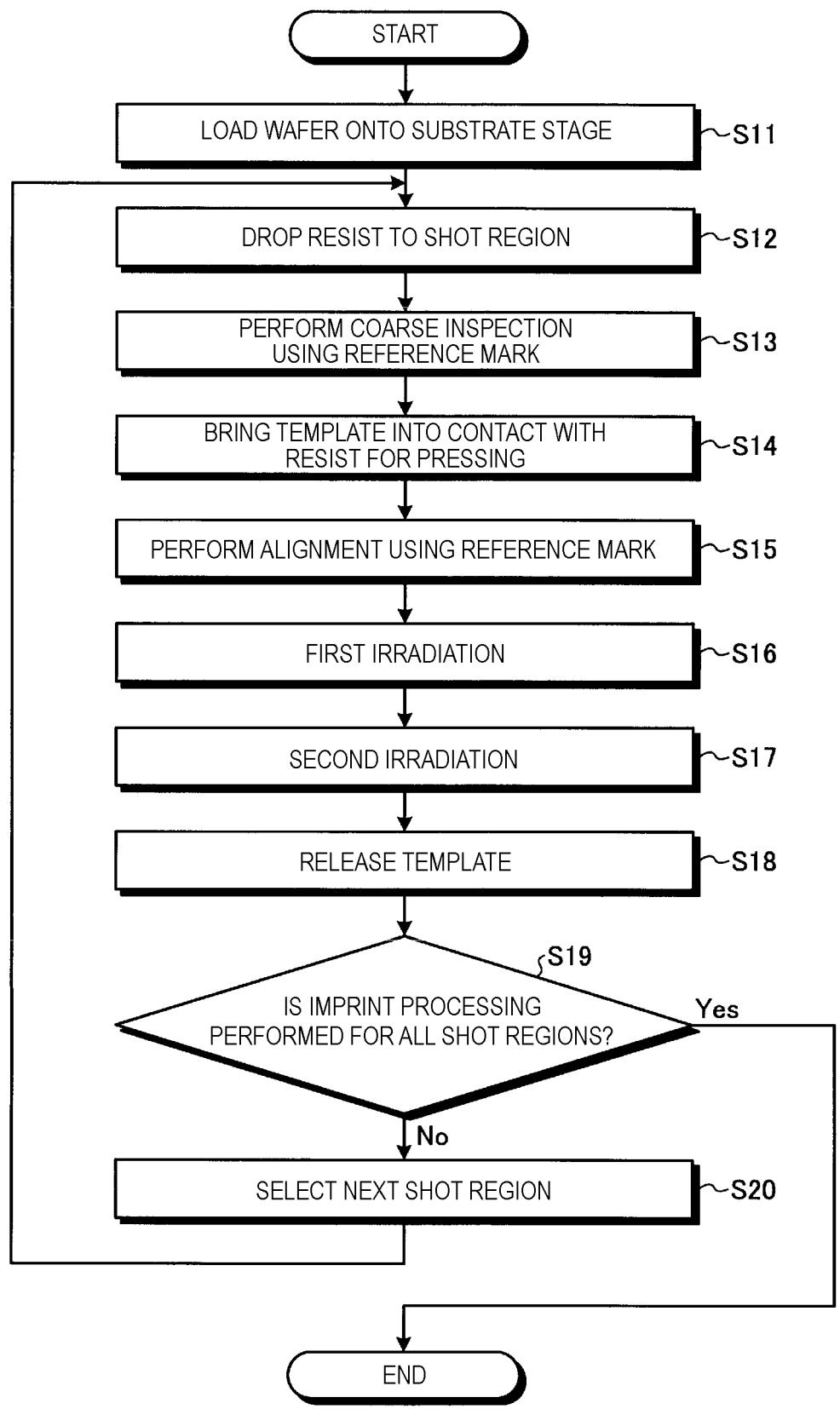
FIG. 5 is a flowchart illustrating an example of a procedure of imprint processing in the imprint apparatus according to the first embodiment.

Next, an example of imprint processing in the imprint apparatus 10 will be described with reference to FIG. 5. FIG. 5 shows a flowchart illustrating an example of a procedure of imprint processing in the imprint apparatus 10 according to the first embodiment.

In step S11, the wafer 100 is loaded onto the wafer holding portion 20 of the imprint apparatus 10. In step S12, the resist 110 is dropped from the resist supply portion 60 onto the shot region 100s to be subjected to the imprint processing of the wafer 100. In step S13, rough alignment (coarse inspection) is performed using the reference mark 220m on the template 200 side and the reference mark 100m on the wafer 100 side. The rough alignment is a coarse alignment performed before bringing the template 200 closer to the wafer 100. In step S14, the template 200 is lowered and brought into contact with the resist 110 on the wafer 100. As a result, the resist 110 gradually fills into the recessed portions of the pattern 210 of the template 200. In step S15, during the pressing processing of the resist 110, fine alignment processing between the template 200 and the wafer 100 is performed using the respective reference marks 220m and 100m. This fine alignment processing is a highly accurate alignment between the template 200 and the wafer 100.

In step S16, a first irradiation is performed while maintaining the state in which the template 200 is in contact with the resist 110. During the first irradiation, the first light source 51a is turned on, and the light passing through the illuminance changing portion 53 is irradiated onto the resist 110 on the wafer 100. As a result, only the edge portion of the resist 110 is cured into a semi-cured state.

In step S17, a second irradiation is performed while maintaining the state in which the template 200 is in contact with the resist 110. In the second irradiation, the second light source 51b is turned on, and the light from the second light source 51b is irradiated onto the resist 110 on the wafer 100. As a result, the entire area of the resist 110 is cured.

In step S18, the template 200 is released from the resist 110 to which the pattern 210 is transferred. In step S19, it is determined whether imprint processing has been performed for all the shot regions 100s on the wafer 100. If imprint processing has not been performed for all the shot regions 100s (No), the next shot region 100s is selected in step S20, and the processing returns to step S12. When the imprint processing has been performed for all the shot regions 100s (Yes), the imprint processing is completed.

When the imprint processing has been completed for all the shot regions 100s, the resist pattern formed by the imprint processing is used as a mask, and an etching is performed on the film to be processed 120 in subsequent processing, for example, by a RIE (Reactive Ion Etching) method. By repeating the above processes, a semiconductor device is manufactured.

Comparative Example

Figure 6:
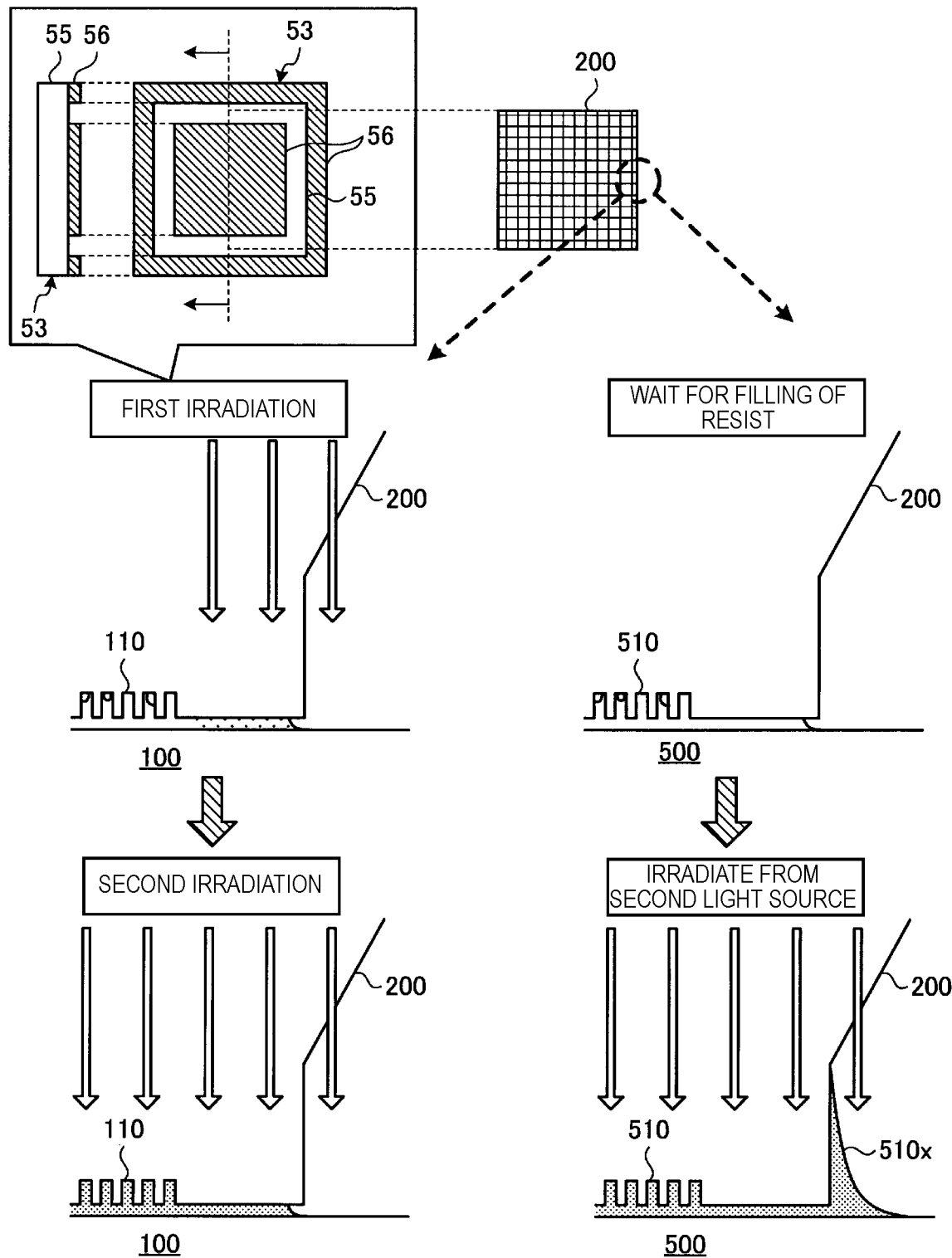
FIG. 6 provides cross-sectional views of a template and wafers during imprint processing, illustrating a comparison between the imprint apparatus according to the first embodiment and an imprint apparatus according to a comparative example.

Here, with reference to FIG. 6, comparison is made between the imprint apparatus 10 of the first embodiment and an imprint apparatus of a comparative example. FIG. 6 shows cross-sectional views of a template 200 and wafers 100 and 500 during imprint processing, illustrating a comparison between the imprint apparatus 10 according to the first embodiment (left side of FIG. 6) and the imprint apparatus according to a comparative example (right side of FIG. 6). The imprint apparatus of the comparative example does not have the first light source and the illuminance changing portion, and cures the resist 510 with only the second light source.

In the imprint apparatus of the comparative example on the right side of FIG. 6, before the light from the second light source is irradiated, the resist 510 on the wafer 500 is filled in the recess portion of the template 200. Therefore, it is necessary to maintain the state in which the template 200 is in contact with the resist for a predetermined time. However, while waiting for filling of the recesses at the central portion of the resist 510, the resist 510 seeps out from just below the template 200 at the edge portion. Furthermore, due to the capillary effect, a phenomenon occurs in which the resist 510 is raised, i.e., pulled, up along the side wall of the template 200. In this state, when light is irradiated to the entire resist 510 from the second light source, the seeped resist 510 is cured, and cured protrusions 510x are generated at the edge portion of the resist pattern. Such protrusions 510x may reach about 1000 μm, which adversely affects subsequent etching processing and the like.

On the other hand, in the imprint apparatus 10 of the first embodiment on the left side of FIG. 6, light is irradiated to the edge portion of the resist 110 from the first light source 51a while the resist 110 in the central portion is filled in the recess portion of the template 200. As a result, filling of the resist 110 at the central portion and curing of the resist 110 only at the edge portion can be performed at the same time. The flowing of the semi-cured resist 110 is suppressed by increasing its viscosity, and leaking and spreading out of the resist to the outside of perimeter of the template 200 is likewise suppressed. Therefore, it is possible to suppress seeping out of the resist 110 and occurrence of protrusions at the edge portion of the resist pattern.

Further, in the imprint apparatus 10 of the first embodiment, the curing of the edge portion of the resist 110 can be started without waiting for filling of the resist 110 into the recessed portions of the template 200 at the central portion where it takes long time to fill them with the resist 110, so that the time required for curing the resist 110 is shortened. Therefore, the throughput can be improved.

Further, the imprint apparatus 10 of the first embodiment has two light sources; the first light source 51a and the second light source 51b. As a result, switching between irradiation of light onto the edge portion of the resist 110 and irradiation of light onto the entire resist 110 can be performed by switching between the first light source 51a and the second light source 51b. In other words, the illuminance distribution of the light within the irradiation surface can be changed by switching the light sources 51a and 51b. Normally, curing of the resist 110 is performed by irradiation of light within a short time of about 1 second, for example. The imprint apparatus 10 can deal with such a change in illuminance distribution in a short time.

(First Variant)

Figure 7:
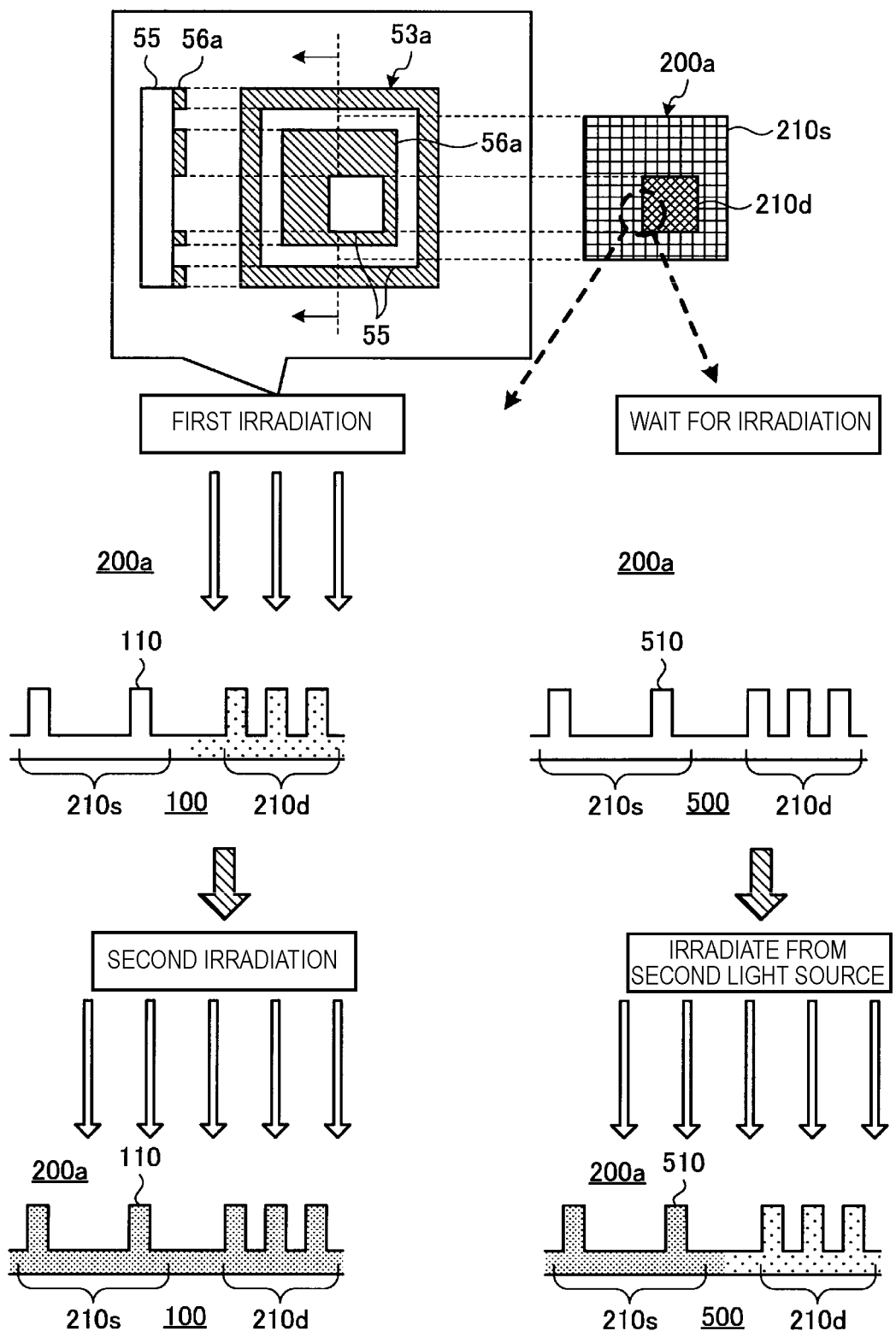
FIG. 7 provides cross-sectional views of a template and wafers during imprint processing, illustrating comparison between the imprint apparatus according to a first variant of the first embodiment and an imprint apparatus according to a comparative example.

Next, an imprint apparatus of a first variant of the present embodiment will be described with reference to FIG. 7. FIG. 7 shows cross-sectional views of a template 200 and wafers 100 and 500 during imprint processing, illustrating a comparison between the imprint apparatus according to the first variant of the first embodiment and an imprint apparatus according to a comparative example.

As shown in FIG. 7, the imprint apparatus of the first variant is different from the above-described embodiment in that a photomask having a different pattern is used as an illuminance changing portion 53a. Hereinafter, only configurations of the embodiment different from the above embodiment will be described.

A template 200a in FIG. 7 includes a sparse pattern 210s where raised template features are spaced a relatively large distance from each other, and a dense pattern 210d where raised template features are spaced a relatively small distance from each other. The sparse pattern 210s is a sparsely packed pattern region, and the dense pattern 210d is a densely packed pattern region. For example, when these sparse and dense patterns 210s and 210d are transferred into a resist, the covering rate of the resist on the wafer surface is lower in the region corresponding to the sparse pattern 210s, and is higher in the region corresponding to the dense pattern 210d. When there is such a difference in density in the pattern to be transferred, the time required for curing the resist may be short in the sparse pattern 210s and may be long in the dense pattern 210d.

As shown in the right side of FIG. 7, in the imprint apparatus of the comparative example which does not have the first light source and the illuminance changing portion, light is irradiated to the entire resist 510 on the wafer 500 for the same period of time. Therefore, the hardness of the resist 510 in the region corresponding to the sparse pattern 210s is different from that in the region corresponding to the dense pattern 210d.

On the other hand, as shown in the left side of FIG. 7, in the first variation, for example, a photomask having a light shielding film 56a for a pattern in which the photomask substrate 55 in the region corresponding to the dense pattern 210d is exposed is used. From the first light source 51a, the resist 110 is irradiated with light through the illuminance changing portion 53a of the photomask. As a result, in addition to the edge portion of the resist 110, curing can be started on the resist 110 in the region corresponding to the dense pattern 210d prior to curing of the resist 110 in the other region. Thereafter, when light is irradiated to the entire resist 110 from the second light source 51b, the resist 110 in the region corresponding to the dense pattern 210d can be cured while the resist 110 in the other region is cured.

(Second Variant)

Figure 8:
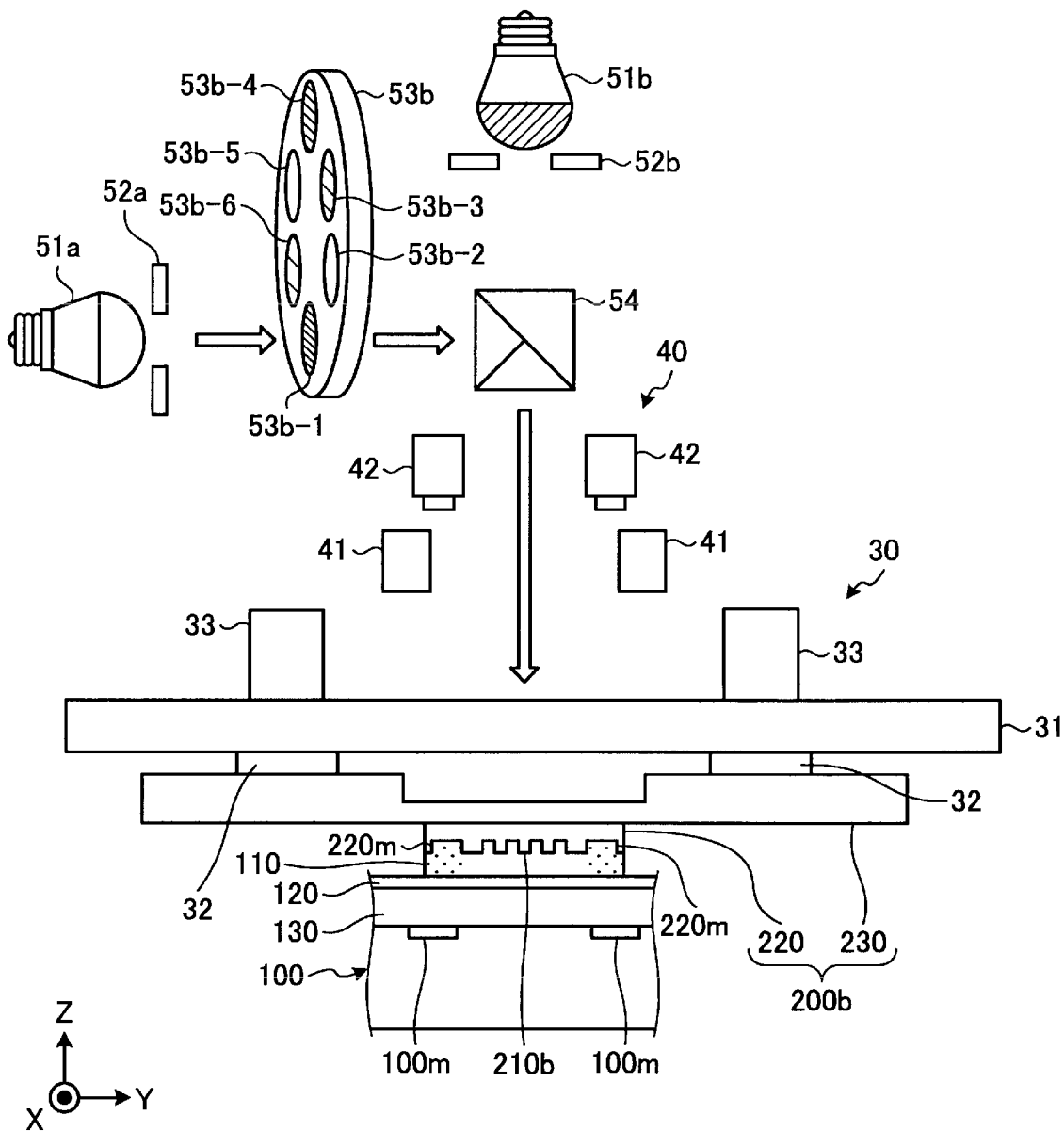
FIG. 8 is an enlarged view of a part of the imprint apparatus according to a second variant of the first embodiment.

Next, the imprint apparatus of a second variant of the present embodiment will be described with reference to FIG. 8. FIG. 8 shows an enlarged view of a part of the imprint apparatus according to a second variant of the first embodiment.

As shown in FIG. 8, the imprint apparatus of the second variant is different from the above-described embodiment in that a turret on which a plurality of photomasks 53b-1, 53b-2 . . . are located is used as an illuminance changing portion 53b. Hereinafter, only configurations of the variant embodiment different from the above embodiment will be described.

The photomasks 53b-1, 53b-2 . . . located on the turret have different light shielding film patterns, respectively. The light shielding film patterns of the photomasks 53b-1, 53b-2 . . . can be used, for example, when the template 200b has a plurality of sparse and dense patterns 210b. That is, the light shielding film patterns can be made different as follows: for example, the photomask substrate 55 in the portion corresponding to the most dense pattern is exposed in the photomask 53b-1, the photomask substrate 55 in the exposed portion of the photomask 53b-1 and the portion corresponding to the medium-dense pattern is exposed in the photomask 53b-2, and so on. If the turret is rotated and the exposed portion of the photomask substrate 55 of the photomask is gradually enlarged while the resist 110 is being cured, the time for completing curing of the resist 110 can be aligned with respect to the plurality of sparse and dense patterns 210b. By appropriately combining these photomasks 53b-1, 53b-2 . . . , it is also possible to shorten the net curing time and improve the throughput.

Further, the light shielding film patterns of these photomasks 53b-1, 53b-2 . . . may correspond to a plurality of templates having different patterns. In this case, each time the template is exchanged, the turret can be rotated so as to use the photomask corresponding to a newly set template. This facilitates adaptation to production lines where small quantities of various types of products flow.

Second Embodiment

Figure 9:
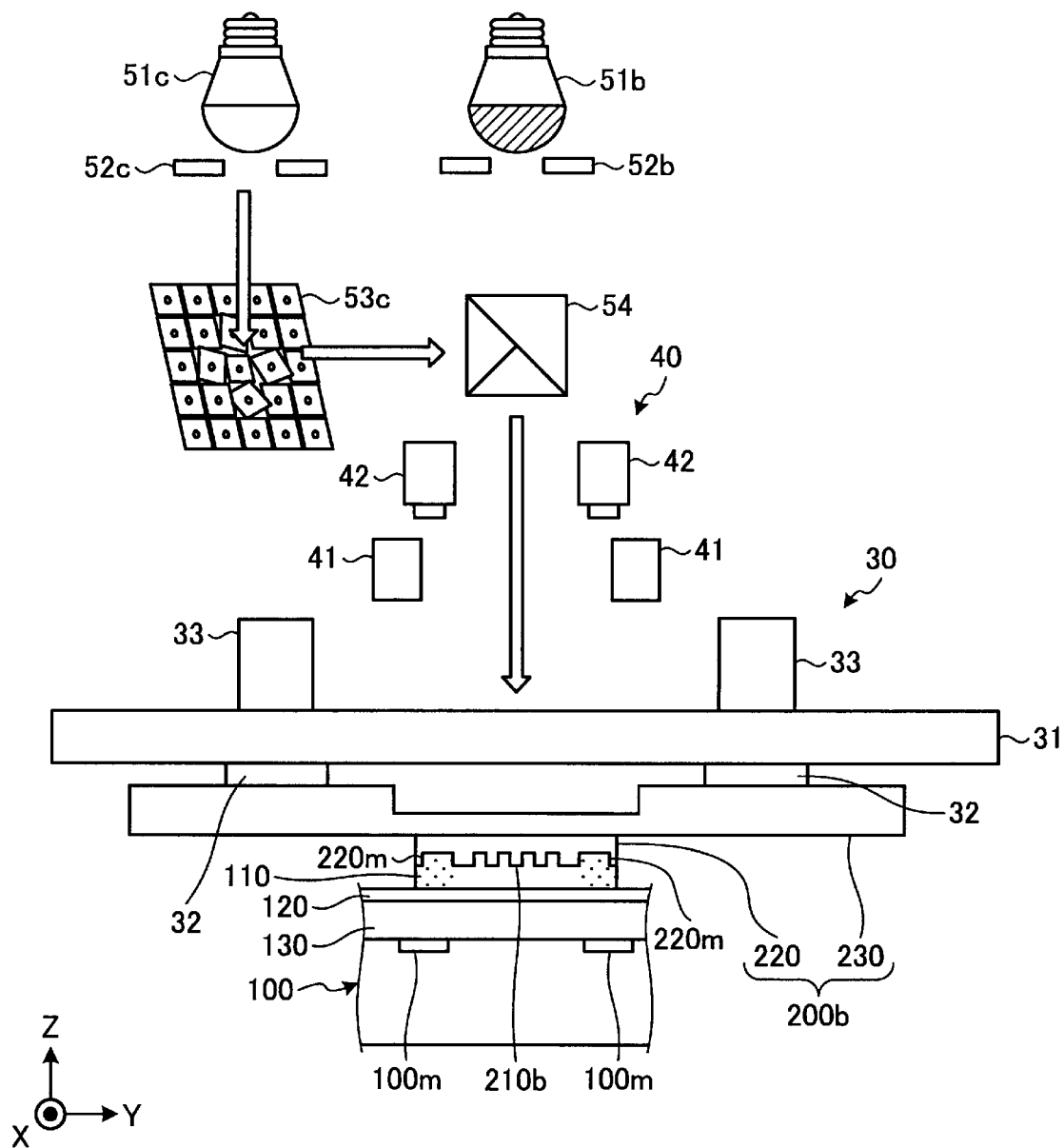
FIG. 9 is an enlarged view of a part of the imprint apparatus according to a second embodiment.

An imprint apparatus according to a second embodiment will be described with reference to FIG. 9. FIG. 9 shows an enlarged view of a part of the imprint apparatus 10 according to the second embodiment.

As shown in FIG. 9, the imprint apparatus of the second embodiment is different from the above-described embodiment in that a DMD (digital mirror device) is used as an illuminance changing portion 53c. Hereinafter, only configurations of the second embodiment different from the above embodiment will be described.

The DMD has a structure in which movable micromirrors are arrayed. By controlling the orientation of each micromirror, the reflection angle and the illuminance of the irradiated light are adjusted. The illuminance changing portion 53c using such a DMD can change the illuminance distribution of the light within the irradiation surface on the wafer 100. In the case where light is irradiated through the illuminance changing portion 53c, a first light source 51c and a first aperture 52c are disposed, for example, at positions laterally aligned with the second light source 51b and the first aperture 52b.

Therefore, similarly to the imprint apparatus 10 of the first embodiment described above, light can be irradiated to the edge portion of the resist 110 and the exposed portion of the wafer 100 outside of the edge portion of the template 200. Thereafter, by irradiating the entire resist 110 using the second light source, it is possible to form a resist pattern while suppressing seepage of the resist 110.

In addition, the illuminance changing portion 53c using such a DMD can change the illuminance distribution of the light within the irradiation surface on the wafer 100 in a sequential manner.

Therefore, for example, the illuminance distribution can be gradually changed while the resist 110 is irradiated with light in one imprint. Thus, for example, it is possible to deal with the template 200b having a plurality of sparse and dense patterns 210b.

Further, for example, the illuminance distribution can be changed for each template having a different pattern. Thus, for example, it is possible to adapt to production lines where small quantities of various types of products flow.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An imprint apparatus, comprising:
a half-silvered mirror positioned to reflect light received from a first angle towards a shot region of a substrate and to transmit light received from a second angle towards the shot region of the substrate;
a first light source positioned to emit light towards the half-silvered mirror from the first angle;
a second light source positioned to emit light towards the half-silvered mirror from the second angle;
an illuminance changing portion configured to change the distribution of light from the first light source before the light reaches the half-silvered mirror, the illuminance changing portion comprises:
a photomask substrate, and
a shielding film on the photomask substrate, the shielding film having a square frame shaped opening with a frame width of 1 mm or less;
a template stage configured to position a template that is smaller in size than the photomask substrate, the template stage positioning the template to be between the half-silvered mirror and the substrate;
a controller configured to control the first light source to emit light and irradiate the shot region on the substrate with the light from the first light source via the half-silvered mirror, the light from the first light source having a distribution changed by the illuminance changing portion, and then after the shot region has been irradiated with the light having the changed distribution from the first light source to control the second light source to emit light without a distribution changed by the illuminance changing portion to irradiate the shot region on the substrate, wherein
the first light source is an ultraviolet light source, and
the second light source is an ultraviolet light source.

2. The imprint apparatus according to claim 1, wherein the illuminance changing portion reduces the irradiation of light at a central portion of the shot region relative to the irradiation of light at an edge portion of the shot region.

3. The imprint apparatus according to claim 2, wherein the illuminance changing portion causes the light emitted from the first light source to be received in the shot region in an irradiation pattern by passing the light emitted from the first light source through the photomask substrate that is positioned between the first light source and the half-silvered mirror.

4. The imprint apparatus according to claim 1, wherein the controller is configured to control the first light source so as to partially cure an edge portion of a resist in the shot region on the substrate, and the second light source so as to fully cure the resist in the shot region on the substrate after the edge portion has been partially cured.

5. The imprint apparatus according to claim 1, wherein the illuminance changing portion comprises a turret on which at least two photomask substrates can be included, the turret being configured to permit each of the at least two photomask substrates to be selectively positioned between the first light source and the half-silvered mirror.

6. The imprint apparatus according to claim 5, wherein the illuminance changing portion reduces the irradiation of light at a central portion of the shot region relative to the irradiation of light at an edge portion of the shot region.

7. The imprint apparatus according to claim 1, wherein the second angle is orthogonal to a surface of the substrate.

8. The imprint apparatus according to claim 6, wherein the first angle is perpendicular to the second angle.

9. The imprint apparatus according to claim 1, wherein the template stage is further configured to bring the template into contact with a resist material on the substrate.

10. The imprint apparatus according to claim 1, wherein the controller is configured to control the first light source and the illuminance changing portion such that light from the first light source irradiates only an outermost circumference of the shot region on the substrate.

11. An imprint apparatus, comprising:
a half-silvered mirror positioned to reflect light received from a first angle towards a shot region on a substrate and to transmit light received from a second angle towards the shot region on the substrate;
a first ultraviolet light source positioned to emit light towards the half-silvered mirror from the first angle;
a second ultraviolet light source positioned to emit light towards the half-silvered mirror from the second angle;
an illuminance changing portion configured to change the distribution of light received at the substrate from the first ultraviolet light source, but not from the second ultraviolet source, the illuminance changing portion comprises:
a photomask substrate, and
a shielding film on the photomask substrate, the shielding film having a square frame shaped opening with a frame width of 1 mm or less; and
a template stage configured to position a template that is smaller in size than the photomask substrate, the template stage positioning the template to be between the half-silvered mirror and the substrate.

12. The imprint apparatus according to claim 11, further comprising:
a controller configured to control the first ultraviolet light source emit light to irradiate the shot region on the substrate, and then to control the second ultraviolet light source to emit light to irradiate the shot region on the substrate.

13. The imprint apparatus according to claim 12, wherein the controller is configured to control the first ultraviolet light source so as to partially cure an edge portion of a resist in the shot region on the substrate, and the second ultraviolet light source so as to fully cure the resist in the shot region on the substrate after the edge portion has been partially cured.

14. The imprint apparatus according to claim 11, wherein the illuminance changing portion reduces the irradiation of light at a central portion of the shot region relative to the irradiation of light at an edge portion of the shot region.

15. The imprint apparatus according to claim 14, wherein the illuminance changing portion causes the light emitted from the first ultraviolet light source to be received in the shot region in an irradiation pattern by passing the light emitted from the first ultraviolet light source through the photomask substrate that is positioned between the first ultraviolet light source and the half-silvered mirror.

16. The imprint apparatus according to claim 11, wherein the illumination changing portion comprises a turret on which at least two photomask substrate can be included, the turret being configured to permit each of the at least two photomask substrates to be selectively positioned between the first ultraviolet light source and the half-silvered mirror.

* * * * *